(12) United States Patent
Uedaira et al.

(10) Patent No.: US 7,509,059 B2
(45) Date of Patent: Mar. 24, 2009

(54) OPTICAL RECEIVER AND DATA COMMUNICATION APPARATUS COMPRISING SAME

(75) Inventors: Yoshitsugu Uedaira, Kyoto (JP); Junji Fujino, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 445 days.

(21) Appl. No.: 11/000,138

(22) Filed: Nov. 30, 2004

(65) Prior Publication Data

US 2005/0123307 A1    Jun. 9, 2005

(30) Foreign Application Priority Data

Dec. 9, 2003    (JP) .............................. 2003-411051

(51) Int. Cl.
*H04B 10/06* (2006.01)
*H03G 3/00* (2006.01)

(52) U.S. Cl. ........................ 398/210; 398/202; 398/208; 398/209

(58) Field of Classification Search .................. 398/202, 398/209, 208, 210
See application file for complete search history.

(56) References Cited

U.S. PATENT DOCUMENTS

| | | | | |
|---|---|---|---|---|
| 4,574,249 | A | * | 3/1986 | Williams ....................... 330/59 |
| 5,864,591 | A | * | 1/1999 | Holcombe .................. 375/345 |
| 6,166,571 | A | * | 12/2000 | Wang .......................... 327/115 |
| 6,359,517 | B1 | * | 3/2002 | Colaco ....................... 330/308 |
| 6,456,141 | B1 | * | 9/2002 | Nishizono et al. ........... 327/345 |
| 6,784,750 | B2 | * | 8/2004 | Chiou et al. ................ 330/308 |
| 6,968,249 | B2 | * | 11/2005 | Nishino et al. .............. 700/108 |

FOREIGN PATENT DOCUMENTS

| | | |
|---|---|---|
| JP | 62-076329 A | 4/1987 |
| JP | 10-190368 A | 7/1998 |
| JP | 2001-127560 A | 5/2001 |
| JP | 2001-144683 A | 5/2001 |
| JP | 2001-230726 | 8/2001 |
| JP | 2002-290168 A | 10/2002 |
| JP | 2003-318681 A | 11/2003 |

OTHER PUBLICATIONS

Official Communication issued in corresponding Japanese Patent Application No. 2003-411051, dated Jun. 6, 2006.
Official communication issued in the corresponding Japanese Patent Application No. 2003-411051, dated Jun. 6, 2006.

* cited by examiner

*Primary Examiner*—Kenneth N Vanderpuye
*Assistant Examiner*—Daniel G Dobson
(74) *Attorney, Agent, or Firm*—Keating & Bennett, LLP

(57) ABSTRACT

An optical receiver is capable of minimizing fluctuations in the pulse width of an electrical signal rendered by converting an optical signal of broad-range illumination. The optical receiver includes a light-receiving element that receives an optical signal and converts the optical signal into a current; a bypass element through which a portion of the current of the light-receiving element flows; an impedance element that detects the remaining portion of the current of the light-receiving element and converts the remaining portion into a voltage signal; a voltage separation element interposed between the impedance element and the light-receiving element that separates the voltages on both sides thereof; and an automatic gain control (AGC) circuit to which the voltage signal from the impedance element is inputted and that controls the current flowing to the bypass element in accordance with the voltage signal.

18 Claims, 3 Drawing Sheets

OPTICAL RECEIVER AND DATA COMMUNICATION APPARATUS COMPRISING SAME

BACKGROUND OF THE INVENTION

1. Field of the Invention

The present invention relates to an optical receiver that receives an optical signal of broad-range illumination and converts the optical signal to an electrical signal, and also relates to a data communication apparatus comprising same.

2. Description of the Related Art

A data communication apparatus that performs data communications by using an infrared optical signal between computers or between a computer and peripheral equipment conforms to the IrDA (Infrared Data Association) standard. Such a data communication apparatus (see, for example, Japanese Patent Application No. 2001-230726) uses an optical receiver that receives an optical signal and converts the optical signal into an electrical signal, and a conventional example of the optical receiver is shown in FIG. 4. An optical receiver 101 is constituted by a photodiode 112, which receives an optical signal and converts the optical signal into a current $I_{PD}$; an impedance element 110 constituted by a resistor, for example, that detects the current $I_{PD}$ and converts the current $I_{PD}$ into a voltage signal; a clamp element 111, which clamps the voltage signal (limits the amplitude thereof); a capacitor 121, which removes the DC voltage of the voltage signal converted by the impedance element 110; an inverting amplifier 122, which inverts and amplifies the voltage signal from which the DC voltage has been removed; and a comparator 127, which outputs, via an output terminal OUT, a signal (electrical signal) that results from a comparison of the output signal of the inverting amplifier 122 with an output reference voltage of an output reference power supply 128. A signal processing device (not shown), which processes an electrical signal corresponding to the received optical signal, is connected to the output terminal OUT.

Further, according to the IrDA standard, the illumination of the optical signal to be received by an optical receiver that is suited to a variety of environments in which data communications are performed is broad-range illumination (from 10 μW/cm² to 500 mW/cm², for example). FIG. 5 shows the current $I_{PD}$ that flows to the photodiode 112 (the current converted by the photodiode 112), the voltage signal from the impedance element 110, that is, the voltage signal $V_A$ at node A in FIG. 4, and the signal of the output terminal OUT, when pulses of optical signal of different illumination are received Case (1) of FIG. 5 represents a case where the optical signal is within the illumination range of the IrDA standard but the illumination is low; Case (2) of FIG. 5 represents a case where the illumination is comparatively high and the clamp element 111 has started operating; and Case (3) of FIG. 5 represents a case where the illumination is higher still and the clamp element 111 fully operates. Thus, the optical receiver 101 is made to correspond with an optical signal of broad-range illumination by limiting the voltage by use of the clamp element 111 in the case where the illumination is high. In FIG. 5, $I_{CLAMP}$ is the current value at which the clamp element 111 operates. The voltage $Vth_A$ is rendered by converting the output reference voltage that is inputted to the comparator 127. When the voltage signal $V_A$ at node A is lower than $Vth_A$, a high level is outputted to the output terminal OUT. When the voltage signal $V_A$ at node A is higher than $Vth_A$, a low level is outputted to the output terminal OUT.

Thus, the optical receiver 101 is able to output a pulse-like electrical signal, which is a logical signal, from the output terminal OUT in correspondence with an optical signal of broad-range illumination. However, when the illumination of the optical signal is high, the photodiode 112 enters a saturated state, and, hence, extra time is required to restore the original state after the pulse end of the optical signal by eliminating the electron/positive-hole pairs that have accumulated in the photodiode 112, and the current $I_{PD}$ continues to flow over this interval. Therefore, as shown by Cases (1), (2), and (3) of FIG. 5, the pulse width ($t_{PW1}$, $t_{PW2}$, $t_{PW3}$) of the output terminal OUT expands as the illumination of the optical signal increases.

Meanwhile, IrDA-standard data communications include high-speed data communications with a communication speed of 4-Mbps, and corresponding devices have also been produced. When the pulse width fluctuates in such high-speed data communications, the load on the signal processing device, to which the pulse from the output terminal OUT is inputted and processed, is large and, hence, in extreme cases, the occurrence of a signal-processing malfunction is a matter of concern. A higher-speed 16-Mbps data communication standard has also been established. It is assumed that, in this case, the load on the signal processing device is even greater and that malfunctions may occur more often.

SUMMARY OF THE INVENTION

In order to overcome the problems described above, preferred embodiments of the present invention provide an optical receiver that is able to output an electrical signal which is stable with respect to an optical signal of broad-range illumination and, more precisely, that is capable of suppressing fluctuations in the pulse width of an electrical signal, and also provide a data communication apparatus that is able to perform data communications that are stabilized by using the optical receiver.

In order to resolve the above-described problems, the optical receiver according to a preferred embodiment of the present invention includes a light-receiving element that receives an optical signal and converts the optical signal into a current; a bypass element through which a portion of the current of the light-receiving element flows; an impedance element that converts the remaining portion of the current of the light-receiving element into a voltage signal; a voltage separation element interposed between the impedance element and the light-receiving element that separates the voltages on both sides; and an automatic gain control circuit that controls the current flowing to the bypass element in accordance with the voltage signal from the impedance element.

The optical receiver according to this preferred embodiment of the present invention stabilizes the current flowing to the impedance element, even when the illumination of the optical signal has increased, by reducing the current as a result of the automatic gain control circuit controlling the current of the bypass element and, therefore, the optical receiver makes it possible to suppress fluctuations in the pulse width of an electrical signal with respect to an optical signal of broad-range illumination, whereby a stable electrical signal can be outputted.

A data communication apparatus according to another preferred embodiment of the present invention is a data communication apparatus that includes the optical receiver according to the preferred embodiment of the present invention described above, wherein the optical signal is an infrared signal.

Other features, elements, characteristics and advantages of the present invention will become more apparent from the

DETAILED DESCRIPTION OF THE PREFERRED EMBODIMENTS

Figure 1:
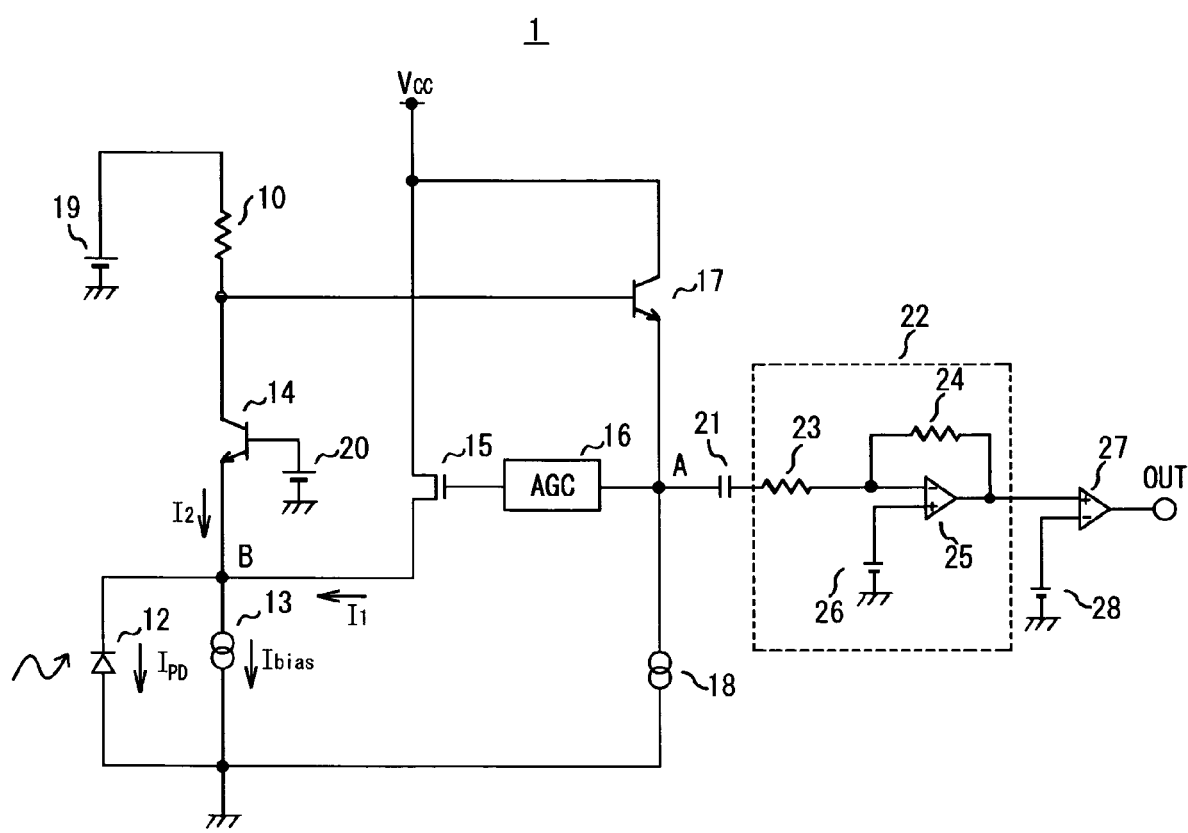
FIG. 1 is a circuit diagram of the optical receiver according to a preferred embodiment of the present invention.

Preferred embodiments of the present invention will be described hereinbelow with reference to the drawings. FIG. 1 is a circuit diagram of an optical receiver 1 according to a preferred embodiment of the present invention. The optical receiver 1 preferably includes, as principal constituent elements, a light-receiving element 12, which preferably is a photodiode, for example, that receives an optical signal and converts same into the current $I_{PD}$; a bypass element 15, which preferably is an N-type MOS transistor, for example, through which a portion $I_1$ of the current $I_{PD}$ of the light-receiving element 12 flows; an impedance element 10, which preferably is a resistor, for example, that detects the remaining portion 12 of the current $I_{PD}$ of the light-receiving element 12 and converts the current into a voltage signal; a voltage separation element 14, which preferably is an NPN-type bipolar transistor, for example, interposed between the impedance element 10 and light-receiving element 12 that separates the voltages on both sides; and an automatic gain control (AGC) circuit 16, to which the voltage signal from the impedance element 10 is inputted and which controls the current flowing to the bypass element 15 in accordance with the voltage signal.

More specifically, the anode of the light-receiving element 12 is grounded, while the cathode thereof is connected, at node B, to the emitter of the voltage separation element 14 and to the source of the bypass element 15. A constant current source 13, through which a bias current $I_{BIAS}$ flows, is arranged in parallel with the light-receiving element 12. The collector of the voltage separation element 14 is connected to one end of the impedance element 10 and to the base of an NPN-type bipolar transistor 17 and the base of the voltage separation element 14 is connected to a voltage separation reference power supply 20. The NPN-type bipolar transistor 17 and a constant current source 18 (described subsequently) constitute an emitter-follower circuit. The other end of the impedance element 10 is connected to a detection reference power supply 19. The collector of the NPN-type bipolar transistor 17 is connected to a power supply Vcc, the emitter of the NPN-type bipolar transistor 17 is connected to one end of the constant current source 18, the other end of which is grounded, to one end of a capacitor 21, and to the input terminal AGCin (shown in FIG. 2) of the automatic gain control circuit 16, which will be described in detail subsequently, at node A. The drain of the bypass element 15 is connected to the power supply Vcc, and the gate of the bypass element 15 is connected to the output terminal AGCout of the automatic gain control circuit 16. The other end of the capacitor 21 is connected to one end of a resistor 23 and the other end of the resistor 23 is connected to one end of a resistor 24 and to the inversion input terminal of an operating amplifier 25. The resistors 23 and 24 and the operating amplifier 25 constitute an inverting amplifier 22 and an amplification reference voltage of an amplification reference power supply 26 is inputted to the non-inversion input terminal of the operating amplifier 25. The output terminal of the operating amplifier 25 is connected to the non-inversion input terminal of a comparator 27, while an output reference voltage of an output reference power supply 28 that is higher than the amplification reference voltage is inputted to the inversion input terminal of the comparator 27 and the output terminal of the comparator 27 is connected to the output terminal OUT of the optical receiver 1.

Figure 2:
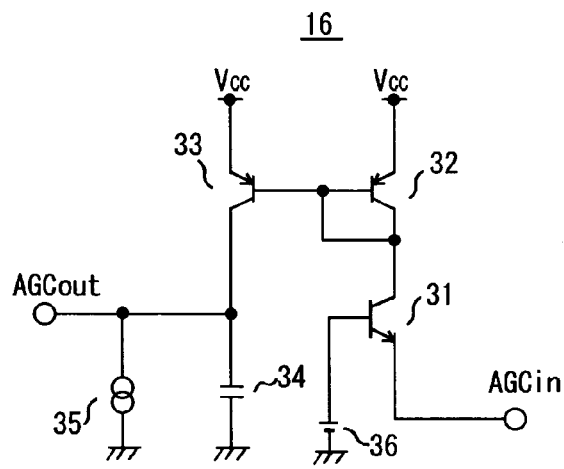
FIG. 2 is a circuit diagram of the automatic gain control (AGC) circuit of the optical receiver of the preferred embodiment of the present invention of FIG. 1.

More specifically, the automatic gain control circuit 16 has the constitution shown in FIG. 2. The input terminal AGCin of the automatic gain control circuit 16 is connected to the emitter of an NPN-type bipolar transistor 31. An automatic gain control reference voltage of an automatic gain control reference power supply 36 is inputted to the base of the NPN-type bipolar transistor 31 and the collector of the NPN-type bipolar transistor 31 is connected to the base and collector of a PNP-type bipolar transistor 32 and to the base of a PNP-type bipolar transistor 33. Further, the emitters of the PNP-type bipolar transistors 32 and 33 are both connected to the power supply Vcc. Therefore, the PNP-type bipolar transistors 32 and 33 constitute a current mirror circuit. The collector of the PNP-type bipolar transistor 33 is connected to one end of a capacitor 34 and to one end of a constant current source 35, and to the output terminal AGCout of the automatic gain control circuit 16. The other ends of the capacitor 34 and constant current source 35 are grounded. Therefore, the automatic gain control circuit 16 starts to output a control signal (the voltage of the capacitor 34) to the bypass element 15 when the voltage signal $V_A$ at node A in accordance with the voltage signal converted by the impedance element 10 is at a predetermined value in relation to the automatic gain control reference voltage. The control signal (voltage of the capacitor 34) supplied to the bypass element 15 increases in accordance with an increase in the amplitude of the voltage signal $V_A$. In this way, the automatic gain control circuit 16 controls the current flowing to the bypass element 15 to stabilize the current flowing to the impedance element 10.

Next, the operation of the optical receiver 1 will be described. First, when an optical signal is not received, the bias current $I_{BIAS}$ of the constant current source 13 flows to the impedance element 10 via the voltage separation element 14. Hence, a predetermined DC voltage is produced in the impedance element 10. Node A is then at a DC voltage that has dropped from the DC voltage of the impedance element 10 to an extent corresponding with the forward bias voltage Vf between the base and emitter of the NPN-type bipolar transistor 17. The automatic gain control reference voltage of the automatic gain control reference power supply 36 is set so that the automatic gain control circuit 16 does not operate at this DC voltage, that is, so that the voltage signal $V_A$ at node A does not reach the above-mentioned predetermined value. Therefore, current does not flow to the NPN-type bipolar transistor 31 or to the PNP-type bipolar transistors 32 and 33 and the voltage of the capacitor 34 is discharged to ground potential by the constant current source 35. Hence, current does not flow to the bypass element 15. The voltage at node B is at a DC voltage that has dropped from the voltage separation reference voltage of the voltage separation reference power supply 20 to an extent corresponding with the forward bias voltage Vf between the base and emitter of the voltage separation element 14. Further, since the capacitor 21 prevents the transmission of the DC voltage, the output of the inverting amplifier 22 is equal to the amplification reference voltage of the amplification reference power supply 26 and a low level is outputted to the output terminal OUT.

A case where the light-receiving element 12 receives an optical signal will now be described on the basis of FIG. 3. When the light-receiving element 12 receives an optical signal, the current $I_{PD}$ flows in accordance with the illumination of the optical signal. In a case where the illumination of the optical signal is within the illumination range of the IrDA standard (from 10 μW/cm² to 500 mW/cm², for example) but the illumination is low (shown in Case (1) of FIG. 3), the voltage signal $V_A$ at node A from the impedance element 10 does not reach the predetermined value and the automatic gain control circuit 16 does not operate. As a result, current does not flow to the bypass element 15. The current $I_{PD}$ therefore flows as is to the impedance element 10 via the voltage separation element 14 and a small voltage signal is produced in the negative direction in the impedance element 10. The small voltage signal is transmitted to node A to become the voltage signal $V_A$, passes through the capacitor 21 and is inverted and amplified by the inverting amplifier 22 to become a small voltage signal in the positive direction. The small voltage signal outputted by the inverting amplifier 22 is compared with the output reference voltage by the comparator 27 and a high level (positive pulse) is outputted to the output terminal OUT.

Figure 3:
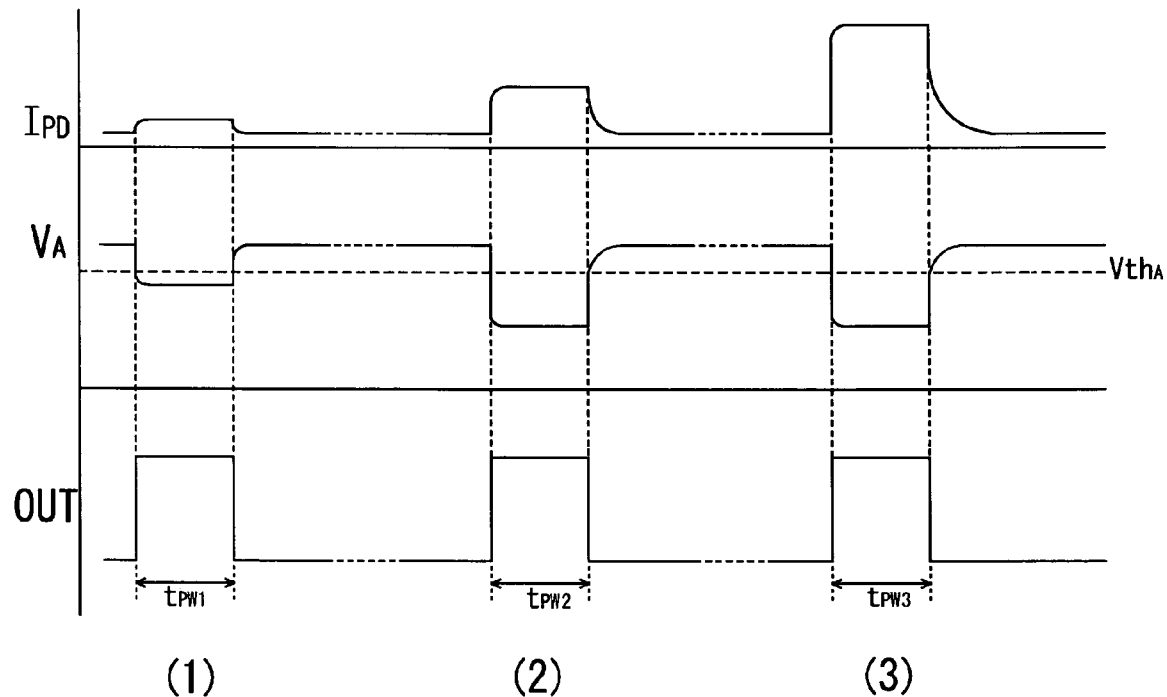
FIG. 3 is an operation waveform diagram of the optical receiver of the preferred embodiment of the present invention of FIG. 1.

In cases where the illumination of the optical signal exceeds a predetermined illumination (1 mW/cm², for example) (Cases (2) and (3) of FIG. 3), the automatic gain control circuit 16 operates and a portion $I_1$ of the current $I_{PD}$ of the light-receiving element 12 then flows to the bypass element 15. The remaining portion $I_2$ of the current $I_{PD}$ of the light-receiving element 12 flows to the impedance element 10 via the voltage separation element 14 and a small voltage signal corresponding with the current $I_2$ is produced in the negative direction. The small voltage signal reaches node A to become the voltage signal $V_A$. As well as Case (1), the voltage signal $V_A$ is converted by the capacitor 21, inverting amplifier 22 and comparator 27, and a high level (positive pulse) is outputted to the output terminal OUT. The voltage signal $V_A$ is also inputted to the automatic gain control circuit 16. When the amplitude of the voltage signal $V_A$ at node A exceeds a predetermined value, current then flows to the NPN-type bipolar transistor 31 and the PNP-type bipolar transistors 32 and 33 of the automatic gain control circuit 16. If the current in the PNP-type bipolar transistor 33 is greater than the current of the constant current source 35, the voltage of the capacitor 34 rises and the current $I_1$ flows to the bypass element 15.

Here, if the illumination of the optical signal exceeds a predetermined illumination (1 mW/cm², for example), even when the illumination varies, the current $I_2$ flowing to the impedance element 10 does not change and the waveform of the small voltage signal of the impedance element 10 (that is, the voltage signal $V_A$ at node A) does not change. That is, the current $I_{PD}$ of the light-receiving element 12 increases when the illumination of the optical signal increases and the increment of the current $I_{PD}$ is the increment of the current $I_1$ flowing to the bypass element 15. Supposing that the current $I_2$ flowing to the impedance element 10 increases, the amplitude of the voltage signal $V_A$ at node A (that is, the input terminal AGCin of the automatic gain control circuit 16) increases, the voltage of the output terminal AGCout of the automatic gain control circuit 16 rises, the current $I_1$ of the bypass element 15 increases. As a result, the current $I_2$ flowing to the impedance element 10 is reduced. Thus, the current $I_2$ flowing to the impedance element 10 is stabilized. Hence, the waveform of the small voltage signal of the impedance element 10 (that is, the voltage signal $V_A$ at node A) is retained as a result of the action of negative feedback. Therefore, even when the illumination of the optical signal increases as shown in Cases (1), (2), and (3) of FIG. 3, there is barely any change in the pulse widths ($t_{PW1}$, $t_{PW2}$, $t_{PW3}$) of the output terminal OUT so that the pulse widths ($t_{PW1}$, $t_{PW2}$, $t_{PW3}$) of the output terminal OUT remain substantially the same at all levels of illumination of the optical signal.

Therefore, the optical receiver 1 according to the present preferred embodiment of the present invention reliably minimizes fluctuations in the pulse width of an electrical signal that are rendered by converting an optical signal of broad-range illumination.

Figure 4:
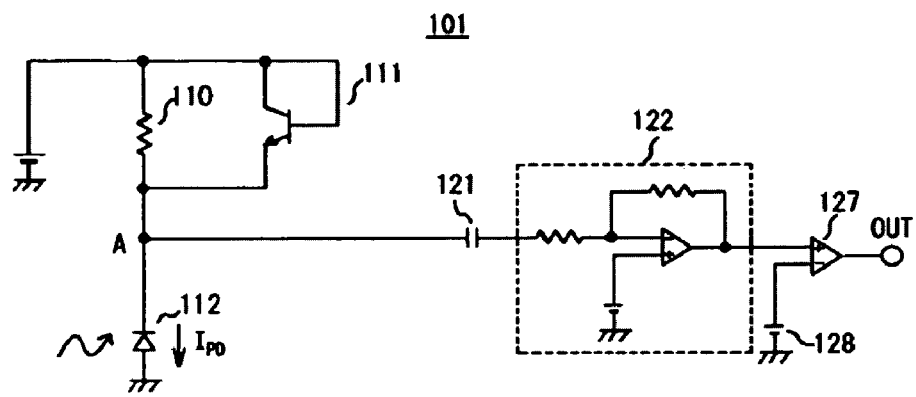
FIG. 4 is a circuit diagram of an optical receiver of the prior art.
Figure 5:
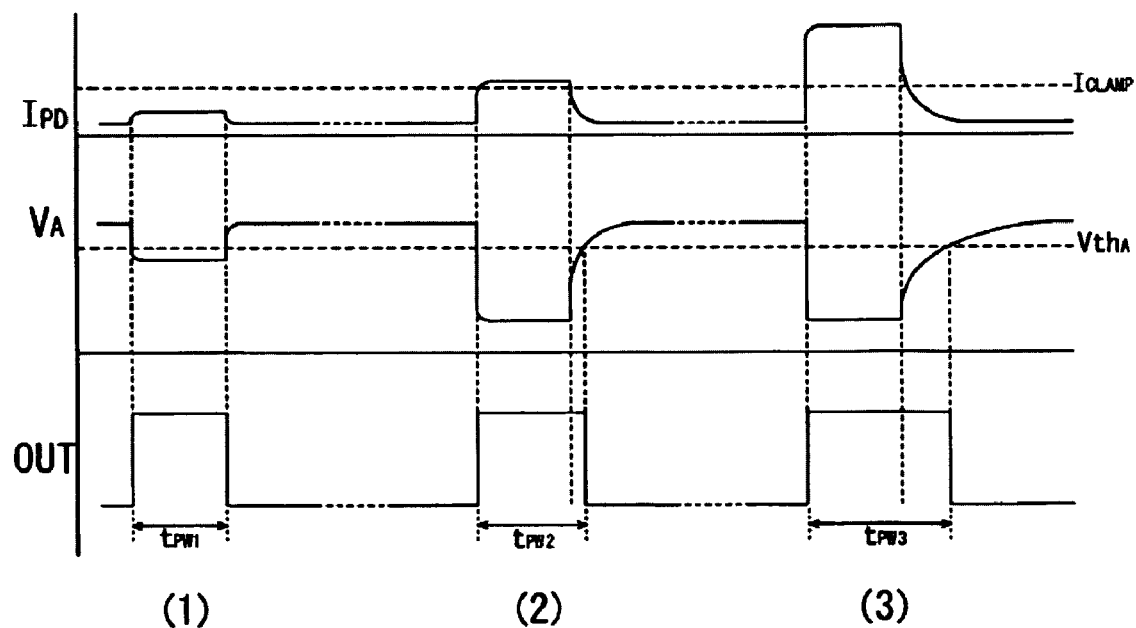
FIG. 5 is an operation waveform diagram of the optical receiver of the prior art.

In addition, generally, the small voltage signal (S) of the impedance element 10 is proportional to the resistance value and the thermal noise (N) is proportional to the square root of the resistance value. Therefore, the S/N ratio is enhanced if the resistance value is increased. However, the conventional optical receiver 101 shown in FIG. 4 is unable to increase the resistance value because, when the resistance value of the impedance element 110 is increased, the outputted pulse width also increases further. In contrast, the optical receiver 1 according to a preferred embodiment of the present invention automatically stabilizes the current $I_2$ flowing to the impedance element 10 by controlling the current $I_1$ of the bypass element 15. Therefore, the resistance value of the impedance element 10 can be freely increased and the S/N ratio can be enhanced.

Further, when an IrDA-standard data communication apparatus is constituted by using the optical receiver 1, high-speed data communications by an infrared optical signal with a communication speed of 4 Mbps can be stabilized.

The present invention is not limited to the above-described preferred embodiments. Rather, a variety of design modifications within the scope of the following claims is possible.

What is claimed is:

1. An optical receiver, comprising:
    a light-receiving element that receives an optical signal and converts the optical signal into a current;
    a bypass element through which a portion of the current of the light-receiving element flows;
    an impedance element that converts a remaining portion of the current of the light-receiving element into a voltage signal;
    a voltage separation element interposed between the impedance element and the light-receiving element and arranged to separate the voltages on both sides thereof; and
    an automatic gain control circuit arranged to control the current flowing to the bypass element in accordance with the voltage signal from the impedance element; wherein
    the automatic gain control circuit includes an NPN-type bipolar transistor, the NPN-type bipolar transistor including an emitter that is arranged to receive the voltage signal from the impedance element and a base connected to an automatic gain control reference power supply, and the NPN-type bipolar transistor being arranged such that the current flows to the NPN-type bipolar transistor when the voltage signal reaches a predetermined value.

2. The optical receiver according to claim 1, wherein the light-receiving element is a photodiode.

3. The optical receiver according to claim 1, wherein the bypass element is an N-type MOS transistor, a gate of the N-type MOS transistor being connected to an output of the automatic gain control circuit and a source of the N-type MOS transistor being connected to a cathode of the light-receiving element.

4. The optical receiver according to claim 3, wherein a drain of the N-type MOS transistor is connected to a power supply.

5. The optical receiver according to claim 1, wherein the impedance element is a resistor.

6. The optical receiver according to claim 1, wherein the voltage separation element is an NPN-type bipolar transistor, an emitter of the NPN-type bipolar transistor being connected to a cathode of the light-receiving element, a base of the NPN-type bipolar transistor being connected to a voltage separation reference power supply and a collector of the NPN-type bipolar transistor being connected to the impedance element.

7. The optical receiver according to claim 1, wherein the automatic gain control circuit includes a constant current source and a capacitor arranged in parallel, and the automatic gain control circuit is arranged to control the current flowing to the bypass element by changing the voltage of the capacitor in accordance with the voltage signal from the impedance element.

8. The optical receiver according to claim 1, wherein the automatic gain control circuit further includes a current mirror circuit including two PNP-type bipolar transistors connected to a collector of the NPN-type bipolar transistor and to a power supply.

9. The optical receiver according to claim 8, wherein the automatic gain control circuit includes at least one capacitor and a constant current source, one of the two PNP-type bipolar transistors being connected to the at least one capacitor and the constant current source.

10. The optical receiver according to claim 1, wherein a constant current source, through which a bias current for the impedance element flows, is arranged in parallel with the light-receiving element.

11. The optical receiver according to claim 1, further comprising an emitter-follower circuit arranged to input a signal produced in the impedance element.

12. The optical receiver according to claim 11, wherein the emitter-follower circuit includes an NPN-type bipolar transistor and a constant source.

13. The optical receiver according to claim 12, wherein an emitter of the NPN-type bipolar transistor is connected to an input terminal of the automatic gain control circuit and a base of the NPN-type bipolar transistor is connected to the impedance element, the NPN-type bipolar transistor being arranged to transmit a signal produced in the impedance element to the input terminal of the automatic gain control circuit.

14. The optical receiver according to claim 11, further comprising an inverting amplifier and a capacitor, the capacitor being arranged between the emitter-follower circuit and the inverting amplifier.

15. The optical receiver according to claim 1, wherein the bypass element, the voltage separation element and the automatic gain control circuit operate such that pulse widths of an output terminal of the optical receiver remain substantially constant at all levels of illumination of the optical signal.

16. The optical receiver according to claim 1, wherein the bypass element, the voltage separation element and the automatic gain control circuit operate such that when a level of illumination of the optical signal is low, the automatic gain control circuit does not operate and the current of the light receiving element does not flow to the bypass element, and when a level of illumination of the optical signal is high, the automatic gain control circuit operates and the portion of the current of the light receiving element flows to the bypass element and the remaining portion of the current of the light-receiving element flows to the impedance element via the voltage separation element.

17. A data communication apparatus comprising the optical receiver according to claim 1, wherein the optical signal is an infrared signal.

18. A data communication apparatus according to claim 17, wherein the data communication apparatus is an IrDA-standard data communication apparatus.

* * * * *